United States Patent
Yang et al.

(10) Patent No.: US 8,518,752 B2
(45) Date of Patent: Aug. 27, 2013

(54) INTEGRATED CIRCUIT PACKAGING SYSTEM WITH STACKABLE PACKAGE AND METHOD OF MANUFACTURE THEREOF

(75) Inventors: DeokKyung Yang, Hanam-si (KR); DaeSik Choi, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/629,881

(22) Filed: Dec. 2, 2009

(65) Prior Publication Data

US 2011/0127662 A1    Jun. 2, 2011

(51) Int. Cl.
*H01L 23/28* (2006.01)

(52) U.S. Cl.
USPC ........... 438/126; 257/686; 257/E23.039; 257/E23.069; 257/E23.124; 257/E23.14

(58) Field of Classification Search
USPC ......... 257/686, E23.14, E23.124, E23.039, 257/E23.069; 438/106, 107, 126
See application file for complete search history.

(56) References Cited

U.S. PATENT DOCUMENTS

| | | | |
|---|---|---|---|
| 7,317,247 B2 * | 1/2008 | Lee et al. .................. 257/706 |
| 7,368,319 B2 * | 5/2008 | Ha et al. ................... 438/109 |
| 7,390,700 B2 * | 6/2008 | Gerber et al. ............. 438/108 |
| 7,557,443 B2 * | 7/2009 | Ye et al. .................... 257/723 |
| 7,633,157 B2 * | 12/2009 | Jiang et al. ............... 257/724 |
| 2003/0218263 A1 * | 11/2003 | Blaszczak et al. ........ 257/788 |
| 2007/0040261 A1 * | 2/2007 | Hetzel et al. .............. 257/686 |
| 2009/0236720 A1 | 9/2009 | Yoon et al. | |

OTHER PUBLICATIONS

U.S. Appl. No. 12/209,838, filed Sep. 12, 2009, Bae et al.
U.S. Appl. No. 12/410,983, filed Mar. 25, 2009, Ha et al.
U.S. Appl. No. 12/238,153, filed Sep. 25, 2008, Pagaila et al.
U.S. Appl. No. 12/580,933, filed Oct. 16, 2009, Park et al.
U.S. Appl. No. 12/239,715, filed Sep. 26, 2008, Choi et al.

* cited by examiner

Primary Examiner — John C Ingham
(74) Attorney, Agent, or Firm — Ishimaru & Associates LLP (57) ABSTRACT

A method of manufacture of an integrated circuit packaging system includes: providing a package base having an inward base side and an outward base side; mounting a device over the inward base side and connected to the outward base side; connecting a silicon interposer having a through silicon via to the device and having an external side facing away from the device; and applying an encapsulant around the device, over the package base, and over the silicon interposer with the external side substantially exposed, the encapsulant having a protrusion over the outward base side.

20 Claims, 5 Drawing Sheets

INTEGRATED CIRCUIT PACKAGING SYSTEM WITH STACKABLE PACKAGE AND METHOD OF MANUFACTURE THEREOF

TECHNICAL FIELD

The present invention relates generally to an integrated circuit packaging system, and more particularly to a package on package system.

BACKGROUND ART

A tremendous market growth for high density and high output/input integrated circuit packages has resulted in a trend for electronic products that are lightweight, smaller in size, multi-functional, and with higher speeds. Electronic products such as cell phone base products, global positioning systems (GPS), satellites, communication equipment, consumer products, and a vast line of other similar products are in ever increasing global demand.

Products must compete in world markets and attract many consumers or buyers in order to be successful. It is very important for products to continue to improve in features, performance, and reliability while reducing product costs, product size, and equally important to be available quickly for purchase by the consumers or buyers.

Therefore, there is an important need that exists for parts in the package to become thinner. The thinner parts reduce the size of the whole package effectively without sacrificing performance and speed.

Each of the integrated circuit packages within the cell phone can contain large amounts of complex circuitry. The circuitry within each of the integrated circuit packages work and communicate with other circuitry of other integrated circuit packages and electrical parts using electrical connections on circuit boards requiring many connections between packages.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, yield, and costs of products.

Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package base having an inward base side and an outward base side; mounting a device over the inward base side and connected to the outward base side; connecting a silicon interposer having a through silicon via to the device and having an external side facing away from the device; and applying an encapsulant around the device, over the package base, and over the silicon interposer with the external side substantially exposed, the encapsulant having a protrusion over the outward base side.

The present invention provides an integrated circuit packaging system including: a package base having an inward base side and an outward base side; a device mounted over the inward base side and connected to the outward base side; a silicon interposer having a through silicon via connected to the device and having an external side facing away from the device; and an encapsulant around the device, over the package base, and over the silicon interposer with the external side substantially exposed, the encapsulant having a protrusion over the outward base side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact between elements.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
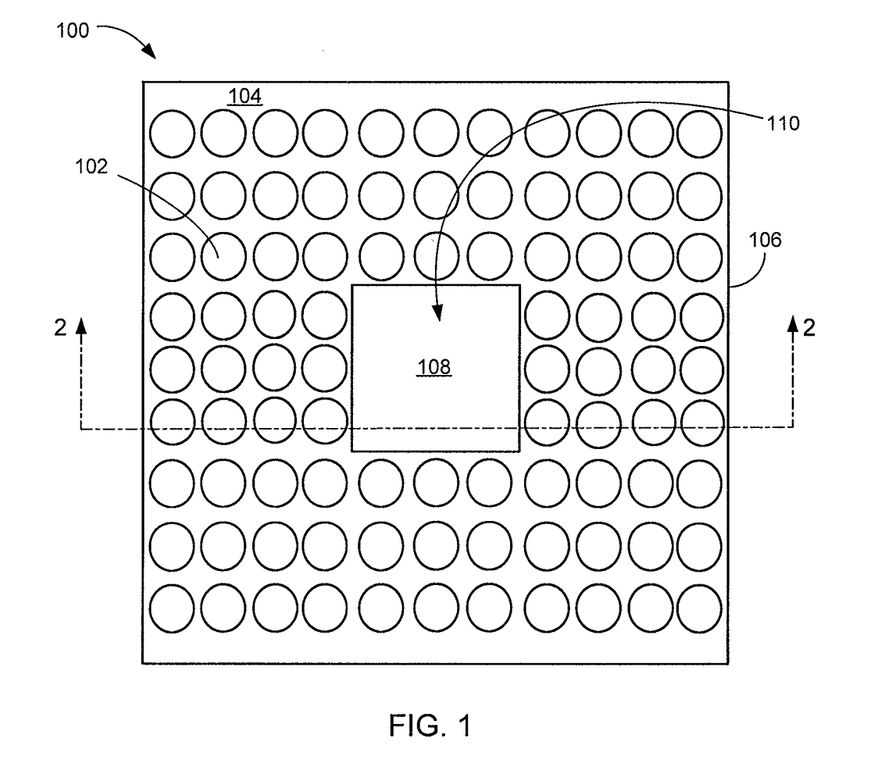
FIG. 1 is a bottom view of an integrated circuit packaging system in a first embodiment of the present invention.

Referring now to FIG. 1, therein is shown a bottom view of an integrated circuit packaging system 100 in a first embodiment of the present invention. Package connectors 102, such as conductive balls, bumps, or pads are shown connecting to an outward base side 104 of a package base 106, such as a board, a substrate, or a circuit board.

For illustrative purposes, the package connectors 102 are shown having a circular shape and formed in rows parallel to or perpendicular to sides of the package base 106 although the package connectors 102 can have any shape, size, orientation, or configuration. For example, the package connectors 102 can have a square shape or have a random distribution across the outward base side 104.

The package connectors 102 are shown surrounding an encapsulant 108, such as an epoxy, an epoxy blend, a silicone material, a polyimide, or a combination thereof, formed as a protrusion 110 having a shape of a rectangle. The protrusion 110 can have any size, shape, or location relative to the package connectors 102. For example, the protrusion 110 can have a shape of an ellipse or can be formed surrounding the package connectors 102 rising a height above the outward base side 104 less than a height of any of the package connectors 102.

Figure 2:
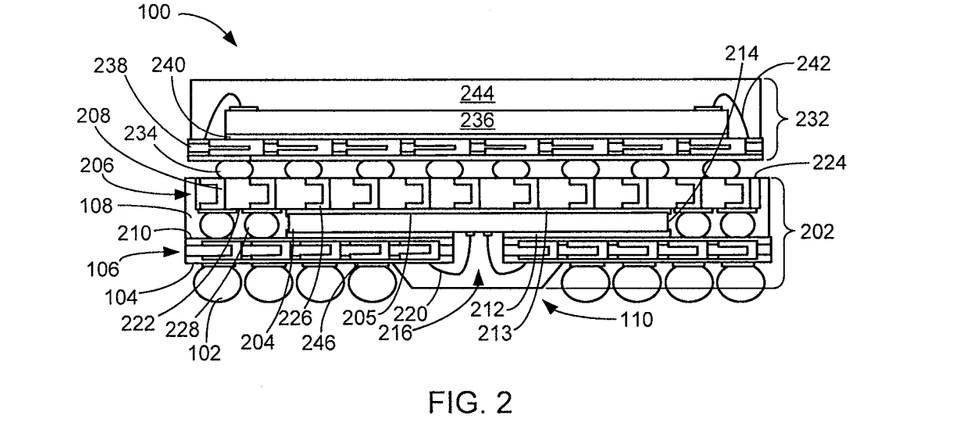
FIG. 2 is a cross-sectional view of the integrated circuit packaging system taken along a line 2-2 of FIG. 1.

Referring now to FIG. 2, therein is shown a cross-sectional view of the integrated circuit packaging system 100 taken along a line 2-2 of FIG. 1. The integrated circuit packaging system 100 can preferably include a stack package 202 having a device 204, such as a chip, a module, or an integrated circuit package. The stack package 202 can also include a silicon interposer 206 with through silicon vias 208, and the package base 106.

The stack package 202, such as a board on chip (BOC), or a board on module package, can include an active side of the device 204 mounted on or over an inward base side 210 of the package base 106 using an adhesive layer 212. The adhesive layer 212 can cover a portion of ends 214 of the device 204. Conductive materials within the package base 106, on the outward base side 104, or on the inward base side 210, can provide connectivity between sides of the package base 106.

The package base 106 can be formed with an opening 216, such as a through hole, passage, or window, at or around a central axis perpendicular to the inward base side 210. The opening can preferably extend through the inward base side 210 and the outward base side 104.

The active side of the device 204 can be connected with the outward base side 104 using through interconnects 220 such as wires, leads, or a combination thereof. A portion of the through interconnects 220 can be extend through the opening 216 between the outward base side 104 and the active side of the device 204.

The silicon interposer 206, such as a silicon carrier, a wafer, or a die, can include an internal side 222 and an external side 224 opposite the internal side 222. Attachment structures 226, such as pads, traces, or redistribution layers, exposed on the external side 224 or the internal side 222 can connect to ends of the through silicon vias 208 to provide connectivity between sides of the silicon interposer 206.

The internal side 222 of the silicon interposer 206 can be mounted on or over the device 204 using an adhesive top layer 213 and oriented with the silicon interposer 206 having the external side 224 facing away from the device 204. The internal side 222 of the silicon interposer 206 can be connected or attached to the inward base side 210 of the package base 106 facing the internal side 210 using internal interconnects 228, such as conductive balls, wire bond wires, or pins, surrounding the device 204. The adhesive top layer 213 is directly on a non-active side 205 of the device 204 and a portion of the ends 214 of the device 204. The silicon interposer 206 is mounted to the device 204 with the adhesive top layer 213. The device 204 is mounted to the package base 106 with the adhesive layer 212.

The encapsulant 108 can surround the silicon interposer 206, the internal interconnects 228, and the device 204. The external side 224 of the silicon interposer 206 can be substantially exposed from the encapsulant 108 and optionally coplanar with a side portion of the encapsulant 108 in direct contact with the external side 224.

The protrusion 110 can be formed with the encapsulant 108 over the opening 216, the internal interconnects 228, and a portion of the outward base side 104 forming a perimeter around the opening 216 and the internal interconnects 228.

The encapsulant 108 can cover the inward base side 210 and surround the internal interconnects 228, the device 204, and the silicon interposer 206. The external side 224 can be substantially exposed of the encapsulant 108 and optionally coplanar with a side of the encapsulant 108 in direct contact with the external side 224 of the silicon interposer 206.

It has been discovered that the silicon interposer 206 with the through silicon vias 208 and the package base 106 with the opening 216 provides multiple component stacking. Multiple component stacking results in reduced package size and is compatible with known good die.

The present invention can provide improved quality and reduce product costs. The device 204 within the integrated circuit packaging system 100 can be pre-tested and verified as a known good die (KGD) prior to mounting or connecting to the package base 106, resulting in significant improvements in product yields, reduction in early life failures (ELF), or scrap costs of good parts, such as the package base 106, the encapsulant 108, or any other parts used in the manufacturing of the integrated circuit packaging system 100.

An integrated circuit package 232, such as a module, a package on package (POP), or a package in package (PIP), can be pre-tested and mounted over the stack package 202. The integrated circuit package 232 can be connected to the external side 224 of the silicon interposer 206 using stack connectors 234, such as balls, bumps, leads, or pins.

It has been discovered that Z-interconnections using through silicon via (TSV) silicon interposers on board on chip packages can stack more live die and provide substantially improved package on package (POP) structures in comparison with the POP structures on a conventional board on chip structure. The silicon interposer 206 with the through silicon vias 208 of the present invention can provide short wire length, improved data transmission bandwidth, improved thermal performance, reduced power consumption, improved yield, improved performance, and a cost effective interconnect solution.

Furthermore, it has been discovered that the overall package size of an integrated circuit packaging system having a through silicon via (TSV) silicon interposer on a board on chip package of can be smaller than a conventional board on chip package. For example, the silicon interposer 206 with the through silicon vias 208 of the present invention can be thinner than a conventional substrate, resulting in the integrated circuit packaging system 100 having a lower Z-height.

The integrated circuit package 232 can include a chip 236, such as a wire bond chip, a flip chip, or other circuitry, mounted over a package substrate 238 using an adhesive 240 similar to the adhesive layer 212. The chip 236 can be connected to the package substrate 238 using chip connectors 242, such as wires, leads, or solder. The chip 236, the package substrate 238, or the chip connectors 242 can be covered with a package encapsulant 244 similar to the encapsulant 108.

The package connectors 102 are shown connecting package base pads 246 attached to the conductive materials within the package base 106. The package connectors 102 can provide connectivity between the integrated circuit packaging system 100 and a next level of integration such as a printed circuit board, a stacking assembly, or external circuitry.

Figure 3:
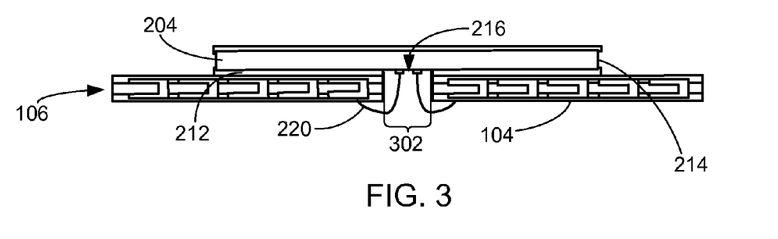
FIG. 3 is the integrated circuit packaging system in a die attaching phase of manufacturing.

Referring now to FIG. 3, therein is shown the integrated circuit packaging system 100 in a die attaching phase of manufacturing. The adhesive layer 212 can be applied on the active side of the device 204 surrounding circuitry connect structures 302, such as pads, contacts, or connectors, of the device 204. The adhesive layer 212 can be applied using a coating process such as a spraying, a dipping, or a brushing process.

The package base 106 can be formed with the opening 216 using a material removal process such as a cutting, a drilling, or a routing process. The active side of the device 204 can be mounted over the package base 106 with the circuitry connect structures 302 oriented over the opening 216.

The through interconnects 220 can extend through the opening 216 connecting the circuitry connect structures 302 with the outward base side 104 of the package base 106. A side of the device 204 opposite the active side of the device 204 and portions of the ends 214 of the device 204 can be covered with the adhesive layer 212 using the coating process.

Figure 4:
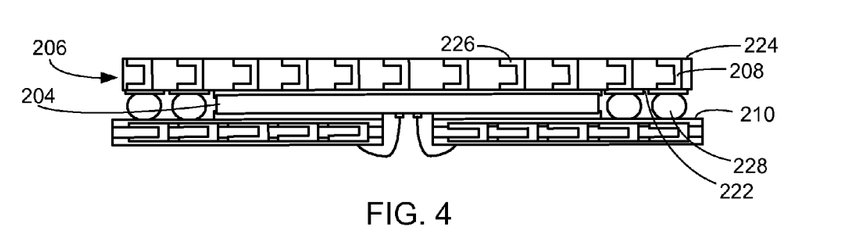
FIG. 4 is the structure of FIG. 3 in an interposer attaching phase.

Referring now to FIG. 4, therein is shown the structure of FIG. 3 in an interposer attaching phase. The through silicon vias 208 formed within the silicon interposer 206 from the internal side 222 to the external side 224 using an via formation process such as etching or drilling and a fill process such as lining, full filling, stud insertion, or combination thereof. The attachment structures 226 can be formed and connected with the through silicon vias 208 and exposed on the internal side 222 and on the external side 224 of the silicon interposer 206.

The internal side 222 of the silicon interposer 206 can be mounted on to the adhesive layer 212 opposite the active side of the device 204 and facing the inward base side 210 of the package base 106. The attachment structures 226 exposed on the internal side 222 surrounding the device 204 can be connected or attached to the inward base side 210 using the internal interconnects 228 and a connecting process such as a solder reflow bonding process using convection heating, ultrasonic, or laser energy.

Figure 5:
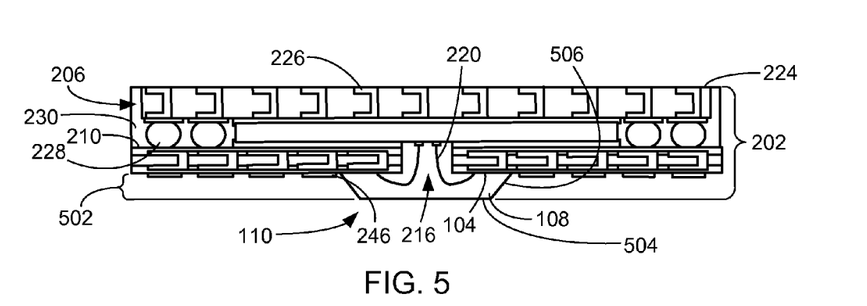
FIG. 5 is the structure of FIG. 4 in an encapsulation phase.

Referring now to FIG. 5, therein is shown the structure of FIG. 4 in an encapsulation phase. The protrusion 110 can be formed covering the through interconnects 220, the opening 216, and a portion of the outward base side 104 surrounding the perimeter of the opening 216 with the encapsulant 108 through/by/with an encapsulation process.

The package base pads 246 can preferably be substantially exposed from the encapsulant 108 of the protrusion 110 using a temporary isolation process such as a molding, a masking, or user specific keep-out technique during the encapsulation process. The protrusion 110 can rise a minimum height 502 over the outward base side 104. The minimum height 502 is defined as the minimum distance measured perpendicularly from the outward base side 104 to a protrusion surface 504 of the protrusion 110.

The protrusion surface 504 can optionally be parallel with the outward base side 104. Elevated sides 506 of the protrusion 110 intersecting the protrusion surface 504 and the outward base side 104 can be formed having either a right angle or an obtuse angle relative to the outward base side 104 surrounding the protrusion 110.

The encapsulant 108 can be applied over the inward base side 210 and surround the internal interconnects 228, the device 204, and the silicon interposer 206 using the encapsulation process and resulting in the stack package 202. The external side 224 of the silicon interposer 206 can be substantially exposed from the encapsulant 108 using the temporary isolation process. The side of the encapsulant 108 in direct contact with the external side 224 can optionally be planarized using a sanding, polishing, or grinding process to be coplanar with the external side 224.

Figure 6:
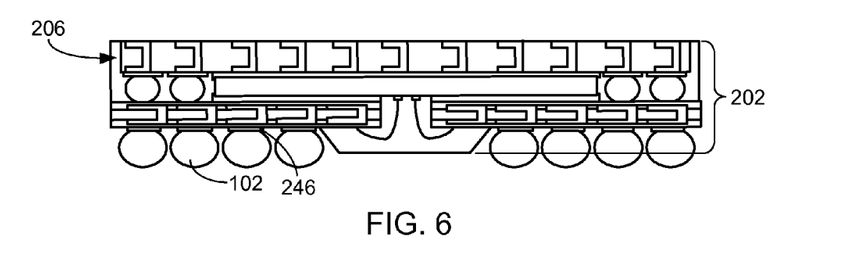
FIG. 6 is the structure of FIG. 5 in a bump attaching phase.

Referring now to FIG. 6, therein is shown the structure of FIG. 5 in a bump attaching phase. The package connectors 102 can be attached to the package base pads 246 of the stack package 202 using the solder reflow bonding process. The integrated circuit package 232 of FIG. 2, can be mounted over the stack package 202 and connected to the silicon interposer 206 using the stack connectors 234 and the connecting process to form the integrated circuit packaging system 100 of FIG. 2.

Figure 7:
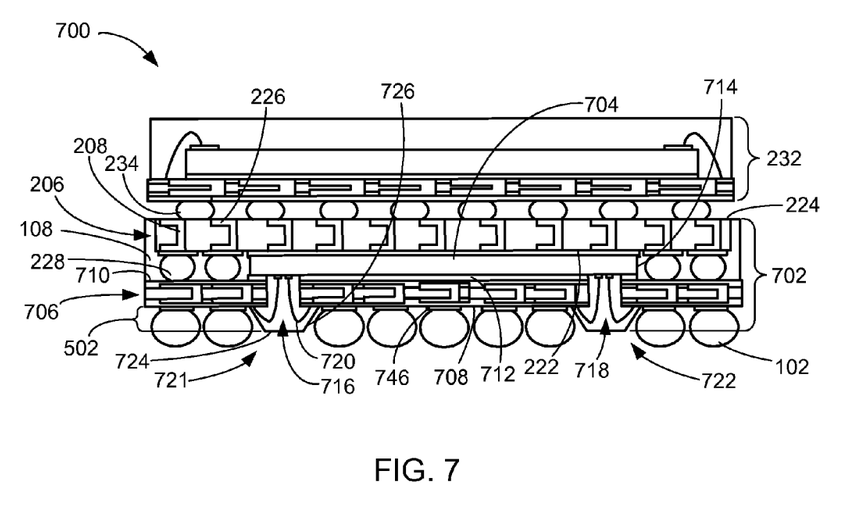
FIG. 7 is a cross-sectional view of an integrated circuit packaging system in a second embodiment of the present invention.

Referring now to FIG. 7, therein is shown a cross-sectional view of an integrated circuit packaging system 700 in a second embodiment of the present invention. The integrated circuit packaging system 700 can preferably include a stack package 702 having a device 704, similar to the device 204 of FIG. 2, the silicon interposer 206, and a package base 706 oriented in a manner similar to the device 204 of FIG. 2 and the package base 106 of FIG. 2.

The package base 706, similar to the package base 106, can include an outward base side 708 and an inward base side 710 opposite the outward base side 708. An adhesive layer 712, similar to the adhesive layer 212 of FIG. 2, can be applied on to ends 714 and sides of the device 704 in a manner similar to the adhesive layer 212 of FIG. 2, the ends 214 of FIG. 2, and the active side and the side opposite the active side of the device 204. The device 704 can be mounted between the silicon interposer 206 and the package base 706 using the adhesive layer.

The package base 706 can be formed with a first opening 716, similar to the opening 216 of FIG. 2, and a second opening 718 similar to the first opening 716. The first opening 716 can preferably be offset towards and parallel to one of the ends 714 of the device 704. The second opening 718 can preferably be offset away from and opposite the first opening 716. The second opening can be parallel to another of the ends 714 opposite the first opening 716.

For illustrative purposes, the integrated circuit packaging system 700 is shown and described having two windows, such as the first opening 716 and the second opening 718. The present invention can have any number of windows. For example, the package base 706 of the integrated circuit packaging system 700 could be formed to include five windows.

An active side of the device 704 can be connected with the outward base side 708 using through interconnects 720 similar to the through interconnects 220 of FIG. 2. A portion of the through interconnects 720 can extend through the first opening 716 between the outward base side 708 and the active side of the device 704 or through the second opening 718 oriented between the outward base side 708 and the active side of the device 704.

A first protrusion 721 formed with the encapsulant 108, similar to the protrusion 110 of FIG. 2, can cover the through interconnects 720, the first opening 716, and a portion of the outward base side 708 surrounding the first opening 716 using an encapsulation process. A second protrusion 722, similar to the first protrusion 721, can cover the through interconnects 720, the second opening 718, and a portion of the outward base side 708 surrounding the second opening 718 using an encapsulation process.

The first protrusion 721 can have an offset from the second protrusion 722 in a manner identical to the offset between the first opening 716 and the second opening 718. The first protrusion 721 or the second protrusion 722 can include the minimum height 502 to a protrusion surface 724 over the first opening 716 or the second opening 718 in a manner similar to the minimum height 502 of FIG. 5, the protrusion surface 504 of FIG. 5, and the opening 216 of FIG. 5.

The protrusion surface 724 of either the first protrusion 721 or the second protrusion 722 can optionally be parallel with the outward base side 814. Elevated sides 726 of the first protrusion 721 or the second protrusion 722 can be formed in a manner similar to the elevated sides 506 of FIG. 5.

The attachment structures 226 exposed on the internal side 222 and connecting to the through silicon vias 208 of the silicon interposer 206 can be connected to the inward base side 710 using the internal interconnects 228.

The encapsulant 108 can cover the inward base side 710 and surround the internal interconnects 228, the device 704, and the silicon interposer 206. The external side 224 can be substantially exposed of the encapsulant 108 and optionally coplanar with the side of the encapsulant 108 in direct contact with the external side 224 of the silicon interposer 206. The integrated circuit package 232 can be mounted over the stack package 702 and connected to the external side 224 using the stack connectors 234.

The package connectors 102 are shown connecting package base pads 746, similar to the package base pads 246 of FIG. 2, attached to the conductive materials within the package base 706. The package connectors 102 can provide connectivity between the integrated circuit packaging system 700 and a next level of integration such as a printed circuit board, a stacking assembly, or external circuitry.

Figure 8:
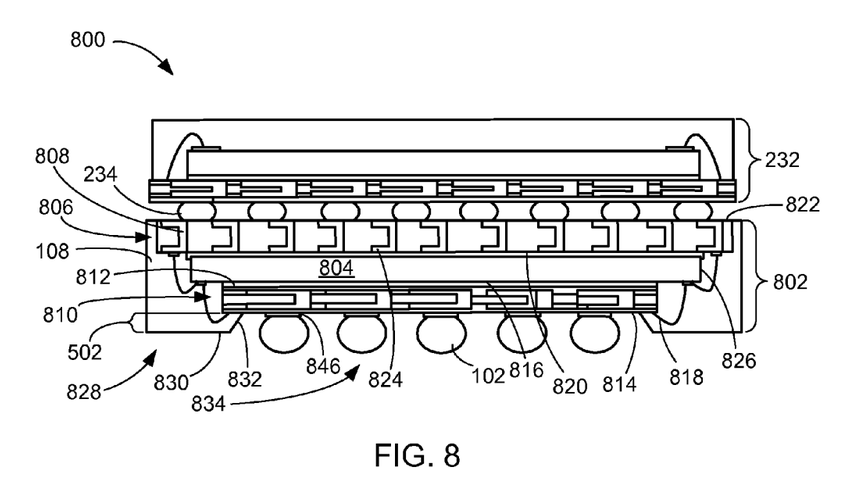
FIG. 8 is a cross-sectional view of an integrated circuit packaging system in a third embodiment of the present invention.

Referring now to FIG. 8, therein is shown a cross-sectional view of an integrated circuit packaging system 800 in a third embodiment of the present invention. The integrated circuit packaging system 800 can preferably include a stack package 802, such as a stack, a board on die, or a board on module package, having a device 804, a silicon interposer 806 with through silicon vias 808, and a package base 810.

The device 804, such as a chip, a module, or an integrated circuit package, can preferably have planar dimensions smaller than planar dimensions of the silicon interposer 806. The package base 810, such as a board, a substrate, or a circuit board, can preferably have planar dimensions smaller than the planar dimensions of the device 804.

The stack package 802 can include an active side of the device 804 mounted over an inward base side 812 of the package base 810 opposite the outward base side 814 using an adhesive layer 816. Conductive materials within the package base 810, on the outward base side 814, or on the inward base side 812, can provide connectivity between sides of the package base 810.

The active side of the device 804 surrounding a perimeter of the package base 810 can be connected to a portion of the outward base side 814 closest to the perimeter of the package base 810 using internal interconnects 818 such as wire bond wires, conductive balls, or pins. The silicon interposer 806, such as a silicon carrier, a wafer, or a die, can include an internal side 820 and an external side 822 opposite the internal side 820. Attachment structures 824, such as pads, traces, or redistribution layers, exposed on the external side 822 or the internal side 820 can connect to ends of the through silicon vias 808 to provide connectivity between sides of the silicon interposer 806.

The silicon interposer 806 can be mounted over the device 804 using the adhesive layer 816 and oriented with the external side 822 facing away from the device 804. The adhesive layer 816 can cover a portion of ends 826 of the device 804.

The internal side 820 of the silicon interposer 806 surrounding a perimeter of the device 804 can be connected to a portion of the active side of the device 804 surrounding the perimeter of the package base 810 using the internal interconnects 818. The encapsulant 108 can surround the package base 810, the internal interconnects 818, the device 804, or the silicon interposer 806.

A protrusion 828 be formed with the encapsulant 108 can cover a perimeter of the outward base side 814 directly connected to the internal interconnects 818. The protrusion 828 can include the minimum height 502 to a protrusion surface 830 over the outward base side 814 in a manner similar to the protrusion surface 504 of FIG. 5 and the outward base side 104 of FIG. 5. The protrusion surface 830 can optionally be parallel with the outward base side 814.

The integrated circuit package 232 can be pre-tested and mounted over the stack package 802. The integrated circuit package 232 can be connected to the external side 822 of the silicon interposer 806 using the stack connectors 234. The package connectors 102 can connect package base pads 846 attached to the conductive materials within the package base 810 in a manner similar to the package base pads 246 of FIG. 2 and the package base 106 of FIG. 2.

Elevated sides 832 of the protrusion 828 can be formed along on an inner perimeter of the protrusion 828 in a manner similar to the elevated sides 506 of FIG. 5. The elevated sides 832 of the protrusion 828 can form a depression 834, such as a crater, a recess, or an indentation containing the package connectors 102 and an exposed portion of the outward base side 814 resulting in an overall package profile lower than an overall package profile of the integrated circuit packaging system 100 of FIG. 2.

It has been found that the combination of wire bond technology with the package base 810 having planar dimensions smaller than planar dimensions of both the device 804 and the silicon interposer 806 can result in a reduction in package size. The integrated circuit packaging system 800 provides a solution having a reduced connectivity footprint as-well-as having smaller planar dimensions over planar dimensions of typical package on package stack solution.

Figure 9:
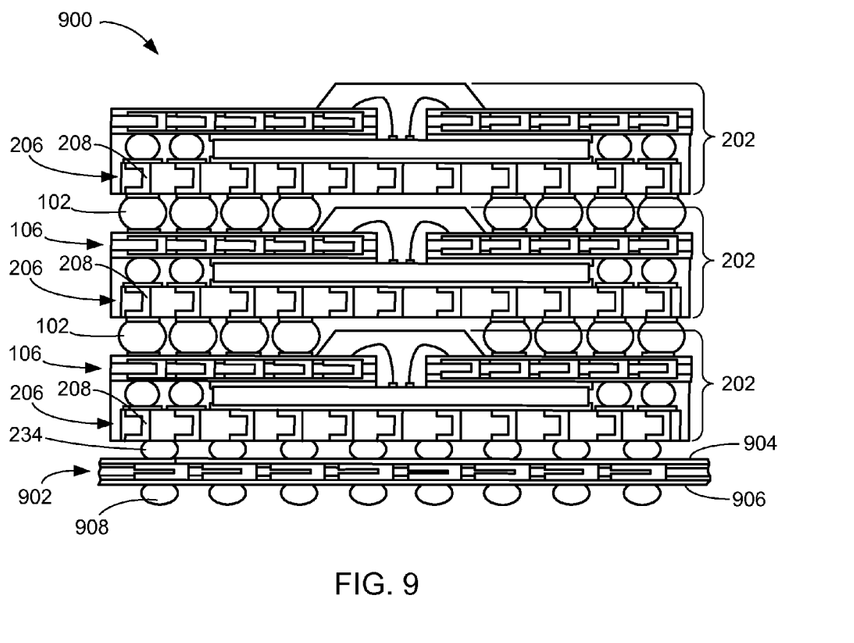
FIG. 9 is a cross-sectional view of an integrated circuit packaging system in a fourth embodiment of the present invention.

Referring now to FIG. 9, therein is shown a cross-sectional view of an integrated circuit packaging system 900 in a fourth embodiment of the present invention. The integrated circuit packaging system 900 can include a stack base 902, such as a board, a substrate, or a circuit board, the stack package 202, another of the stack package 202, and yet another of the stack package 202.

A portion of the stack base 902 is shown having a first side 904 and a second side 906 opposite the first side 904. Conductors on the first side 904, the second side 906, and within the stack base 902 provide connectivity between sides of the stack base 902.

The silicon interposer 206 of the stack base 902 can be mounted over and connected to the conductors on the first side 904 using the stack connectors 234. The silicon interposer 206 of another of the stack package 202 can be mounted over and connected to the package base 106 of the stack base 902 using another of the package connectors 102. The silicon interposer 206 of the yet another of the stack package 202 can be mounted over and connected to the package base 106 of the another of the stack base 902 using yet another of the package connectors 102.

System connectors 908, similar to the package connectors 102 of FIG. 2, can be attached to the conductors on the second side 906 to provide connectivity to a next level of integration such as a printed circuit board, a stacking assembly, or external circuitry. The stacking of the silicon interposer 206 with the through silicon vias 208 of the stack package 202, the another of the stack package 202, and the yet another of the stack package 202 can be used to provide a three-dimensional stacked solution.

Figure 10:
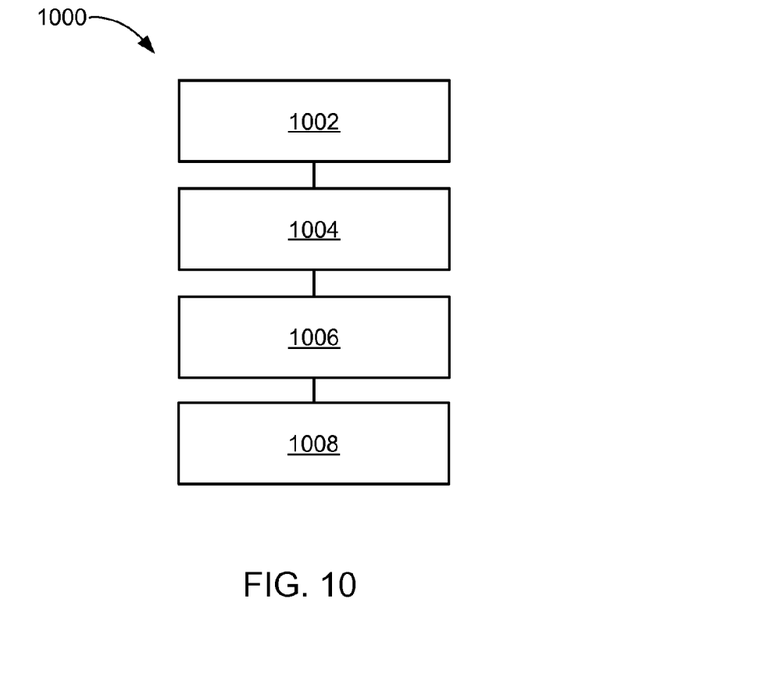
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system in a further embodiment of the present invention. The method 1000 includes providing a package base having an inward base side and an outward base side in a block 1002; mounting a device over the inward base side and connected to the outward base side in a block 1004; connecting a silicon interposer having a through silicon via to the device and having an external side facing away from the device in a block 1006; and applying an encapsulant around the device, over the package base, and over the silicon interposer with the external side substantially exposed, the encapsulant having a protrusion over the outward base side in a block 1008.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package base having an opening, an inward base side, and an outward base side;
   mounting a device on the inward base side and connected to the outward base side, the opening offset towards one of the ends of the device;
   mounting a silicon interposer having a through silicon via and an internal side to the device with an adhesive top layer, the silicon interposer having an external side facing away from the device and the adhesive top layer directly on the non-active side of the device and a portion of an end of the device;
   attaching an internal interconnect to the internal side and to the inward base side, facing each other, using a reflow bonding process; and
   applying an encapsulant around the device, over the package base, and over the silicon interposer with the external side substantially exposed, the encapsulant having a protrusion over the outward base side.

2. The method as claimed in claim 1 further comprising connecting an integrated circuit package over the silicon interposer.

3. The method as claimed in claim 1 wherein forming the protrusion includes forming a depression of the protrusion.

4. The method as claimed in claim 1 wherein forming the encapsulant includes:
   forming a first protrusion over the outward base side; and
   forming a second protrusion over the outward base side.

5. The method as claimed in claim 1 further comprising:
   mounting a stack package over the silicon interposer; and
   mounting another stack package over a silicon interposer of the stack package.

6. A method of manufacture of an integrated circuit packaging system comprising:
   providing a package base having an opening, an inward base side, and an outward base side;
   mounting a device on the inward base side and connected to the outward base side, the opening offset towards one of the ends of the device;
   mounting a silicon interposer having a through silicon via and an internal side to the device with an adhesive top layer, the silicon interposer having an external side facing away from the device and the adhesive top layer directly on the non-active side of the device and a portion of an end of the device;
   attaching an internal interconnect to the internal side and to the inward base side, facing each other, using a reflow bonding process; and
   applying an encapsulant around the device, over the package base, and over the silicon interposer with the external side substantially exposed, the encapsulant having a protrusion on a portion of the outward base side.

7. The method as claimed in claim 6 further comprising connecting an integrated circuit package over the silicon interposer and to the through silicon via.

8. The method as claimed in claim 6 wherein forming the protrusion includes forming a depression of the protrusion having the outward base side partially exposed within the depression.

9. The method as claimed in claim 6 wherein forming the encapsulant includes:
forming a first protrusion over the outward base side; and
forming a second protrusion over the outward base side, the second protrusion offset from the first protrusion.

10. The method as claimed in claim 6 further comprising:
mounting a stack package having a silicone interposer over the package base; and
mounting another stack package having another silicon interposer over a package base of the stack package.

11. An integrated circuit packaging system comprising:
a package base having an opening, an inward base side, and an outward base side;
a device mounted on the inward base side and connected to the outward base side, the opening offset towards one of the ends of the device;
a silicon interposer having a through silicon via and an internal side mounted side to the device with an adhesive top layer, the silicon interposer having an external side facing away from the device and the adhesive top layer directly on the non-active side of the device and a portion of an end of the device;
an internal interconnect attached to the internal side and to the inward base side facing each other, the internal interconnect having characteristics of a reflow bonding process; and
an encapsulant around the device, over the package base, and over the silicon interposer with the external side substantially exposed, the encapsulant having a protrusion over the outward base side.

12. The system as claimed in claim 11 further comprising an integrated circuit package connected over the silicon interposer.

13. The system as claimed in claim 11 wherein the protrusion includes a depression.

14. The system as claimed in claim 11 wherein the encapsulant includes:
a first protrusion over the outward base side; and
a second protrusion over the outward base side.

15. The system as claimed in claim 11 further comprising:
a stack package mounted over the silicon interposer; and
another stack package mounted over a silicon interposer of the stack package.

16. The system as claimed in claim 11 wherein the protrusion is on a portion of the outward base side.

17. The system as claimed in claim 16 further comprising an integrated circuit package connected over the silicon interposer and to the through silicon via.

18. The system as claimed in claim 16 wherein the protrusion includes a depression having the outward base side partially exposed within the depression.

19. The system as claimed in claim 16 wherein the encapsulant includes:
a first protrusion over the outward base side; and
a second protrusion over the outward base side, the second protrusion offset from the first protrusion.

20. The system as claimed in claim 16 further comprising:
a stack package having a silicone interposer mounted over the package base; and
another stack package having another silicon interposer mounted over a package base of the stack package.

* * * * *